(12) United States Patent
Sakama et al.

(10) Patent No.: US 8,049,626 B2
(45) Date of Patent: Nov. 1, 2011

(54) RFID TAG MOUNTING CIRCUIT BOARD

(75) Inventors: Isao Sakama, Hiratsuka (JP); Minoru Ashizawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 595 days.

(21) Appl. No.: 12/039,422

(22) Filed: Feb. 28, 2008

(65) Prior Publication Data
US 2009/0009330 A1 Jan. 8, 2009

(30) Foreign Application Priority Data

Jul. 3, 2007 (JP) ................... 2007-174711

(51) Int. Cl.
*G08B 13/14* (2006.01)
*H01Q 1/50* (2006.01)
(52) U.S. Cl. ............... 340/572.8; 340/572.1; 340/572.7; 343/850
(58) Field of Classification Search .... 340/572.1–572.9; 343/850
See application file for complete search history.

(56) References Cited

U.S. PATENT DOCUMENTS

| 6,118,379 A | 9/2000 | Kodukula et al. |
| 6,133,834 A | 10/2000 | Eberth et al. |
| 6,480,751 B1 * | 11/2002 | Kuribayashi et al. ........... 700/56 |
| 2006/0055617 A1 | 3/2006 | Hall |
| 2007/0023525 A1 * | 2/2007 | Son et al. ...................... 235/454 |

FOREIGN PATENT DOCUMENTS

| GB | 2 284 325 A | 5/1995 |
| JP | 2007-066989 | 3/2007 |
| WO | 97/09641 | 3/1997 |

* cited by examiner

*Primary Examiner* — Benjamin C Lee
*Assistant Examiner* — Michael T Shannon
(74) *Attorney, Agent, or Firm* — Mattingly & Malur, PC

(57) ABSTRACT

An RFID tag mounting circuit board has a configuration in which an RFIC chip, a minimum antenna, a circuit which matches the impedance of the RFIC chip and that of the antenna are mounted on a printed circuit board. With this configuration, the area occupied by the antenna of an RFID tag is suppressed, and a decrease in the component mounting density of the printed circuit board is also suppressed. The RFID tag mounting circuit board is configured to be capable of managing the histories of all components on a per-printed-circuit-board basis by attaching a reading device for an RFIC chip to a chip mounter which mounts an IC chip.

11 Claims, 14 Drawing Sheets

FIG.1A PRIOR ART
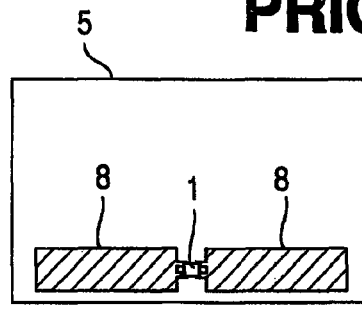
FIG.1B PRIOR ART
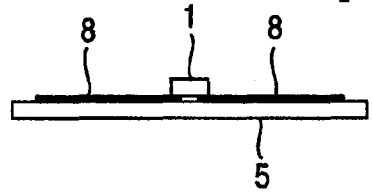
FIG.2A
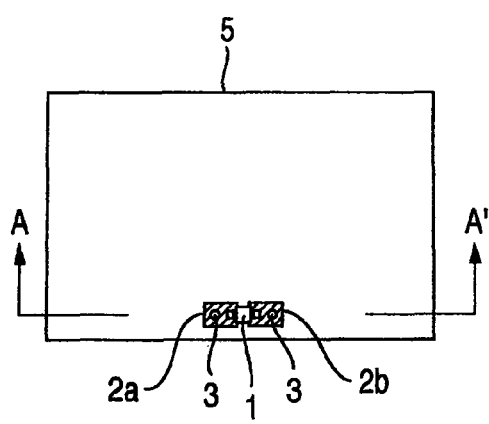
FIG.2C
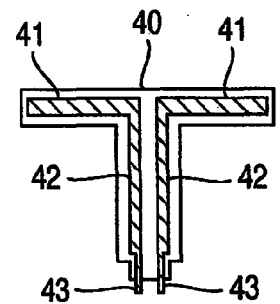
FIG.2B
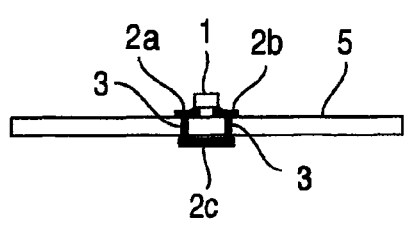
FIG.2D
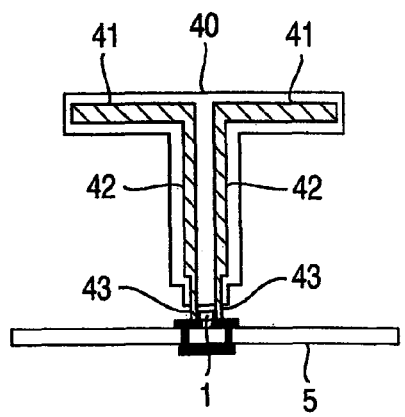

FIG.6
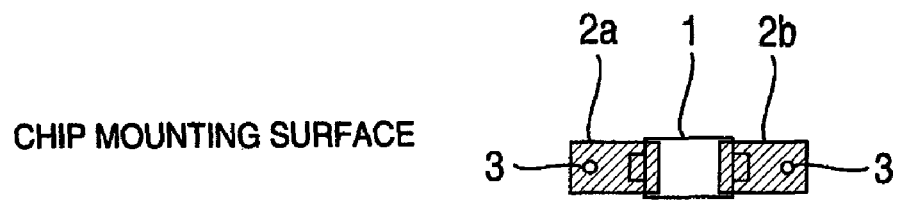
CHIP MOUNTING SURFACE
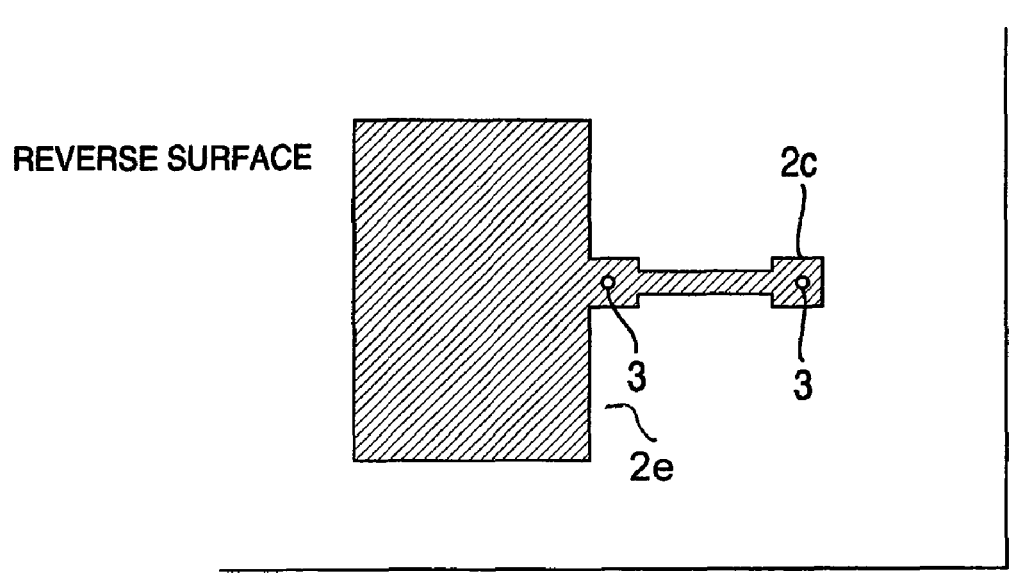
REVERSE SURFACE

FRONT VIEW OF CONNECTION

SIDE VIEW OF CONNECTION

TOP VIEW OF CONNECTION

FIG.10B
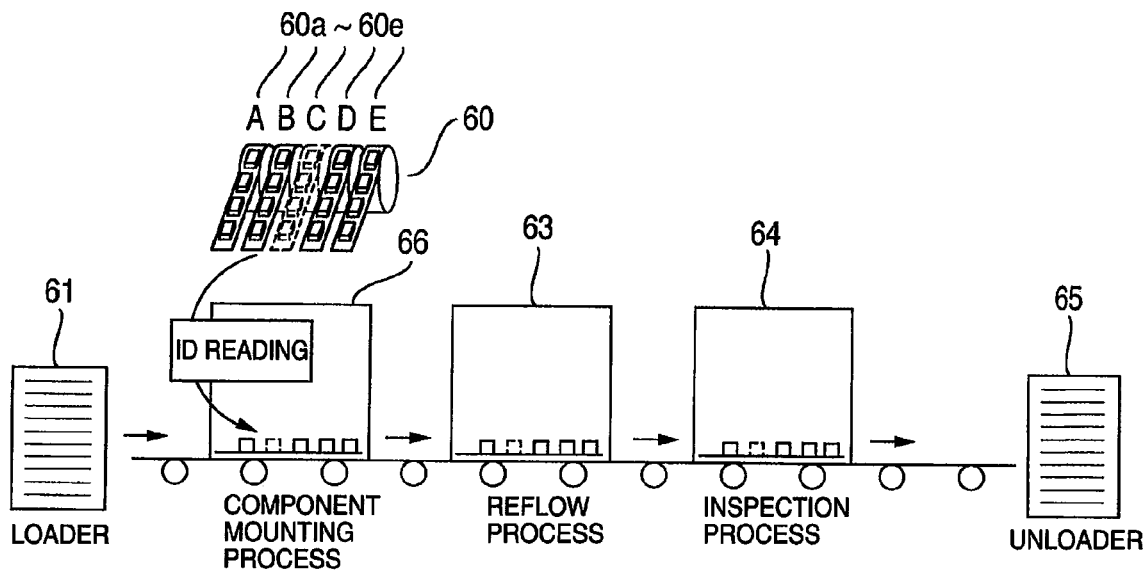
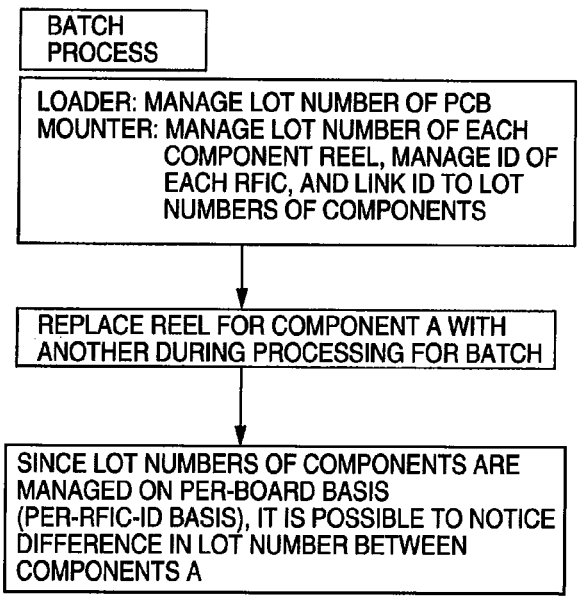

FIG.15
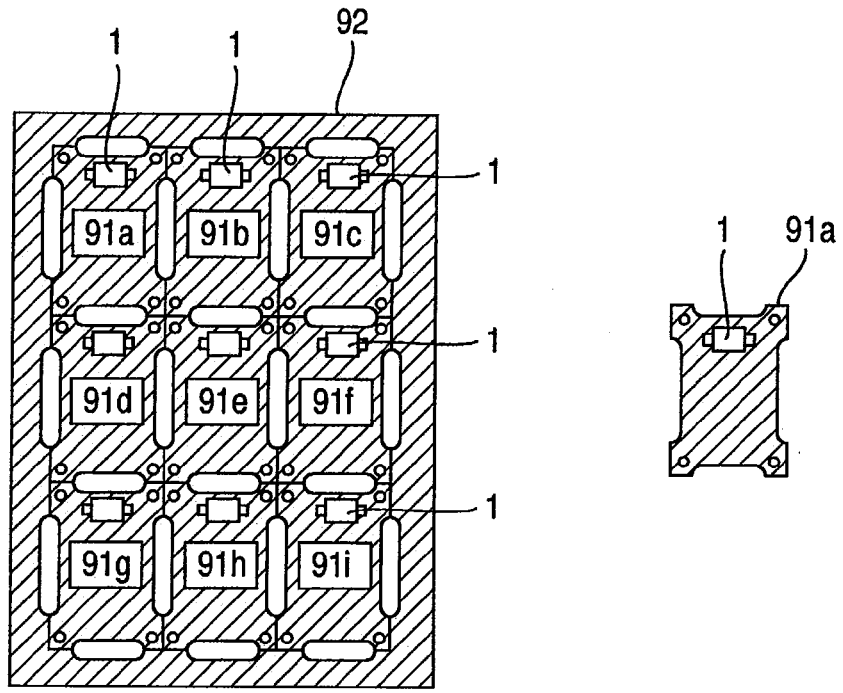
FIG.16A
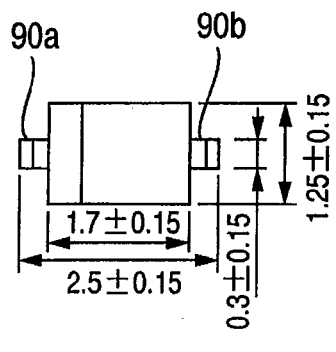
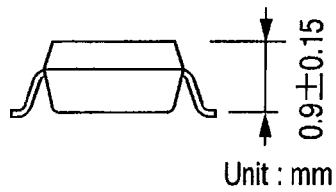
FIG.16B
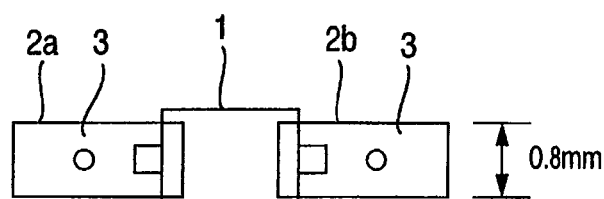
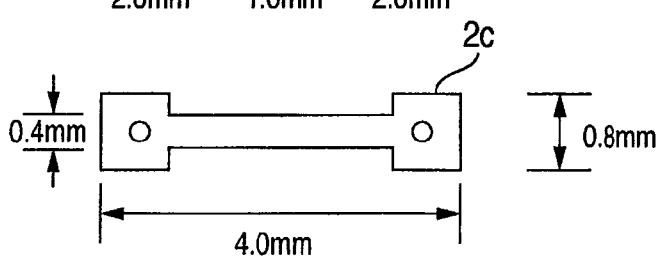

RFID TAG MOUNTING CIRCUIT BOARD

INCORPORATION BY REFERENCE

The present application claims priority from Japanese application JP2007-174,711 filed on Jul. 3, 2007, the content of which is hereby incorporated by reference into this application.

FIELD OF THE INVENTION

The present invention relates to an electronic component device. More particularly, the present invention relates to a technique for managing a printed circuit board on which electronic components are to be mounted and the components are to be mounted thereon using an RFID (Radio Frequency IDentification) tag. Further, the present invention also relates to a technique for forming an RFID tag for component management on a printed circuit board.

BACKGROUND OF THE INVENTION

Examples of a conventional technique for managing the history of an electronic component on a printed circuit board using an RFID tag include one disclosed in JP-A-2007-66989 (Patent Document 1). Patent Document 1 discloses management of the history of an electronic component by mounting an RFID tag having an antenna and an IC chip within a printed circuit board. More specifically, there is disclosed a printed circuit board including at least one conductor layer and having an RFID tag placed therein or thereon which is configured such that the upper and lower surfaces of the RFID tag have no wiring pattern made of the conductor layer. There is also disclosed a printed circuit board including at least one conductor layer and having an RFID tag which is structured such that a through hole having the same vertical and horizontal dimensions as those of the RFID tag is formed in a part of the printed circuit board without any wiring pattern made of the conductor layer and such that the RFID tag is embedded in the through hole.

WO 97/09641 (Patent Document 2) discloses a formation of an antenna of an RFID tag on a printed circuit board (PCB) or at a metal layer in a PCB. The RFID tag includes a semiconductor circuit contained in an electronic package, and an RF antenna unit of the tag is formed in or on the PCB. The electronic package is disclosed to be connected to the antenna via pads on the PCB.

In the technique disclosed in Patent Document 1, a common IC tag, i.e., an antenna having an IC chip mounted thereon is affixed to a printed circuit board. For this reason, printed wiring cannot be provided in a region on the printed circuit board where the antenna is arranged in Patent Document 1.

In the technique disclosed in Patent Document 2, a printed circuit board has an antenna formed thereon and an IC chip mounted thereon. To this end, a multilayer board is employed as the printed circuit board, and the antenna is formed using layers (see FIG. 2 in Patent Document 2). An area larger than that of the IC chip is required to achieve this configuration. In other words, since an antenna is present on a printed circuit board in each of Patent Documents 1 and 2, the component mounting density of the printed circuit board decreases.

The capacitance between an antenna and printed patterns (wiring patterns) peripheral to an RFID tag changes depending on the layout of the printed patterns. This changes the tuning frequency of the antenna and may cause the communication distance of the RFID tag to fluctuate. Accordingly, antenna design needs to consider and include matching of the impedances of an IC chip and an antenna and further needs to be done with peripheral patterns in mind. Printed circuit board-based design is thus required, and the number of man-hours required for design increases.

A case where replacement of lots of mounted components has occurred when a large number of electronic boards are continuously manufactured, i.e., production of electronic boards managed in units of a plurality of electronic boards will be considered next. Hereinafter, one production unit will be referred to as a batch. In a conventional case using a barcode or the like, if components A have run out during processing for a batch, and replacement of component reels for components A has occurred, information indicating that the component reel for components A has been replaced with another is managed as management information, but it is impossible to determine for which printed circuit board of the batch the replacing reel for components A has been used. In other words, lot management of components A to be used cannot be performed. Even if an RFIC (Radio Frequency Integrated Circuit) chip which is easier to individually manage than a barcode is mounted, since an ID can be generally read until after a reflow process, i.e., until the RFIC chip is soldered to a printed circuit board, it is impossible to determine the time of occurrence of replacement of reels for components A (replacement of lots) during processing for a batch, as in the case of a barcode.

When an RFID tag is attached to a printed circuit board in advance, if an ID in an RFIC can be read before a component mounting process (before the RFIC enters a chip mounter), component reel replacement histories can be managed on a per-printed-circuit-board basis. However, the position where a reader antenna is set needs to be adjusted according to the size of the printed circuit board and the position where the RFID tag is attached. If an RFID tag is affixed, poor silk screening may occur due to the thickness of the tag in a solder paste silk screening process. If an RFID tag is embedded in a printed circuit board, costs and the yield in an embedding process become issues.

SUMMARY OF THE INVENTION

The present invention has been made in consideration of the above-described problems, and has as its main object to provide a method for efficiently mounting an RFIC on an electronic board. Another object of the present invention is to manage the history of each component mounted on an electronic board.

To solve the above-described problems, a method for mounting an RFIC chip on a printed circuit board according to the present invention is an RFIC chip mounting method capable of reading unique information in the RFIC chip by sending and receiving electromagnetic waves to and from outside the printed circuit board, wherein the RFIC chip, an antenna, and a circuit which matches the impedance of the RFIC chip and that of the antenna are mounted on the printed circuit board.

A method for managing the histories of components mounted on a printed circuit board according to the present invention is a method in which information in an RFIC chip is read by a chip mounter before mounting the RFIC chip on the printed circuit board, and pieces of information on the components mounted on the printed circuit board are linked to the information, wherein the chip mounter, which mounts the RFIC chip, comprises a reading device for the RFIC chip and an antenna having a connection pad which connects the RFIC chip and antenna. All components mounted on a board may be regarded as mounted components to be managed.

Specific means for implementing these methods will be described in detail in embodiments to be described later.

According to the present invention, it is possible to minimize a decrease in the component mounting density of a printed circuit board even if an RFID tag is mounted on the printed circuit board. It is also possible to manage the history of each component mounted on a printed circuit board.

Other objects, features and advantages of the invention will become apparent from the following description of the embodiments of the invention taken in conjunction with the accompanying drawings.

BRIEF DESCRIPTION OF THE DRAWINGS

FIGS. 1A and 1B are views showing a related-art structure;

FIGS. 2A to 2D are views showing a structure according to an embodiment of the present invention;

FIG. 6 is a view when a larger printed pattern is connected on a reverse surface side;

FIG. 10B is a chart showing a process flow according to the present invention;

FIG. 15 is a schematic view of divided boards; and

FIGS. 16A and 16B are views showing the shape of an IC chip and the shape of a printed pattern according to an embodiment of the present invention.

DETAILED DESCRIPTION OF THE INVENTION

Figure 3:
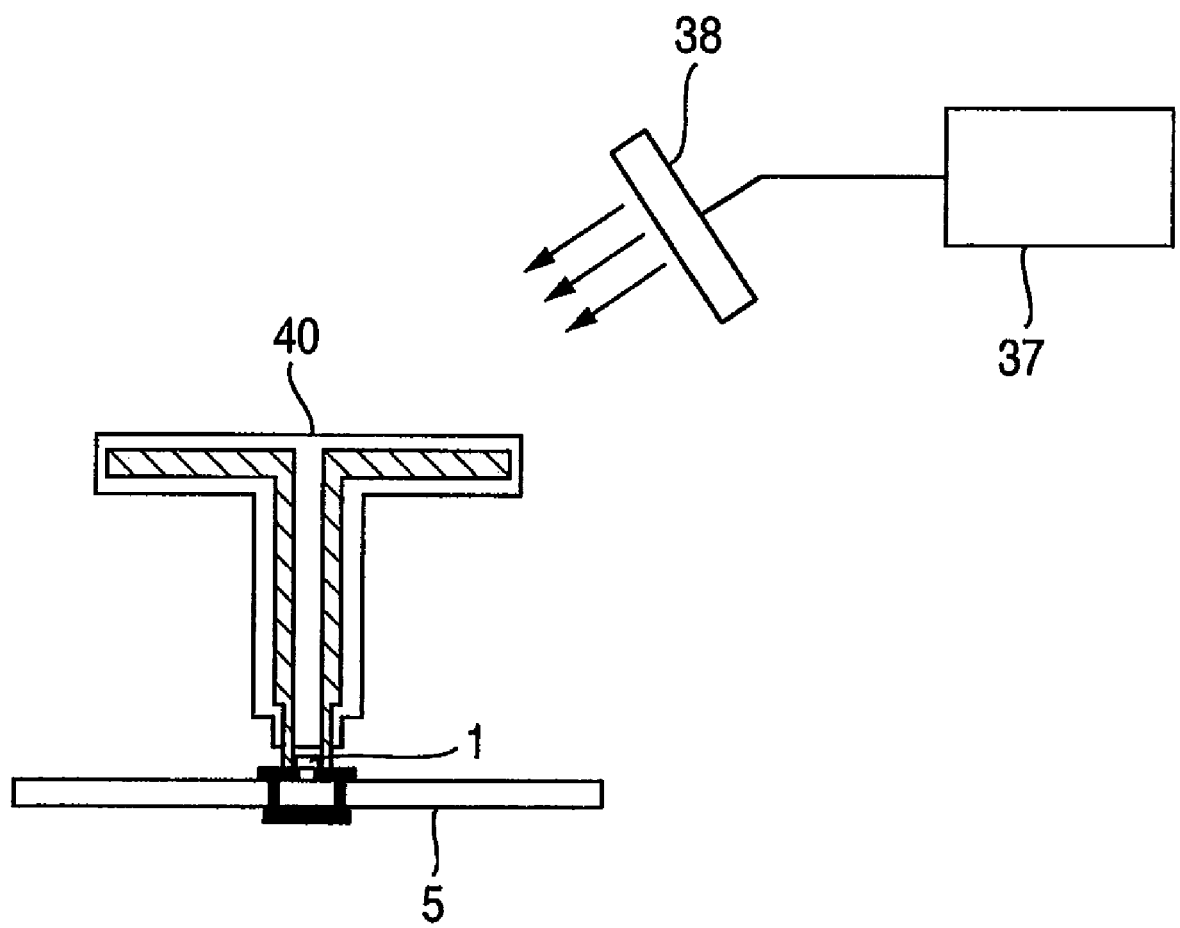
FIG. 3 is a view showing a positional interrelationship according to the embodiment of the present invention.

Embodiments suitable for managing the histories of an RFID mounting circuit board and electronic components mounted on the board according to the present invention will be described below in detail with reference to the drawings. Note that the same structural elements will be denoted by the same reference numerals in the drawings, with reference to which the embodiments will be described below, and that a repetitive description may be omitted.

First Embodiment

An embodiment of the present invention will be described below. FIGS. 1A and 1B are views showing a related-art configuration. As shown in FIGS. 1A and 1B, a dipole antenna 8 with a length of λ/2 is arranged on a surface of a printed circuit board in the related-art configuration. If a small printed circuit board is employed, an area occupied by an antenna 8 used for an RFID tag increases, and the component mounting density of the printed circuit board decreases. FIGS. 2A to 2D are views showing a configuration according to the present invention, which is in contrast with the related-art configuration. FIG. 2A shows a top view of the configuration in which an IC chip 1 and printed patterns 2a and 2b which connect the IC chip 1 and through holes 3 are arranged on a printed circuit board 5. FIG. 2B shows a sectional view of FIG. 2A taken along the line A-A'. FIG. 2C shows an external antenna to be connected to the IC chip 1, and FIG. 2D shows a state in which the external antenna is connected to the IC chip 1.

As shown in FIG. 2B, the printed patterns 2a and 2b are formed on the printed circuit board 5, and the through holes 3 are formed in a direction of thickness of the printed circuit board 5. The printed patterns 2a and 2b are connected to a printed pattern 2c on the reverse surface side of the printed circuit board 5 via the through holes 3. In other words, a stub for an impedance matching circuit is formed using the through holes 3. Since impedance matching is achieved in the IC chip 1, and two terminals of the IC chip 1 are DC-connected to each other, this structure has the effect of improving the electrostatic discharge resistance of the IC chip 1.

FIG. 2C shows an external antenna 40 to be connected to the IC chip 1. The external antenna 40 is formed using a material based on a resin, such as PC (polycarbonate), PP (polypropylene), or PET (polyethylene terephthalate), as a structural material and is composed of antenna units, each of which is made up of a radio emission unit 41 and a field waveguide 42, and connections 43 which are connected to the IC chip 1. To connect the IC chip 1 and connections 43, it suffices to bring the connections 43 into direct contact with pins 90a and 90b of the IC chip 1 or bring the connections 43 into contact with the printed patterns 2a and 2b connected to the IC chip 1.

Each field waveguide 42 in the external antenna 40 can be replaced with a coaxial cable, such as a semirigid cable, or the like.

FIG. 3 shows the arrangement of devices when reading information in the IC chip 1 mounted on the printed circuit board 5. The devices include the printed circuit board 5, the external antenna 40, a reader device 37, and a reader antenna 38 which sends out electromagnetic energy from the reader device. A general-purpose antenna, such as a patch antenna or dipole antenna, can be used as the reader antenna 38. A computer which controls the reader and the like is not shown in FIG. 3. Electromagnetic energy sent out from the reader antenna 38 is received by the external antenna 40. The electromagnetic energy is transmitted to the terminals of the IC chip 1 through the field waveguides 42. Information from the IC chip 1 is sent out toward the reader antenna 38 via the external antenna 40.

As described above, the sending out of information in the IC chip 1 mounted on the printed circuit board 5 via the external antenna 40 allows a general-purpose reader device to easily read the information. It is thus possible to minimize decrease in the component mounting density of the printed circuit board 5. Additionally, since a general-purpose reader device can be used, increase in device cost can be suppressed.

Figure 4A:
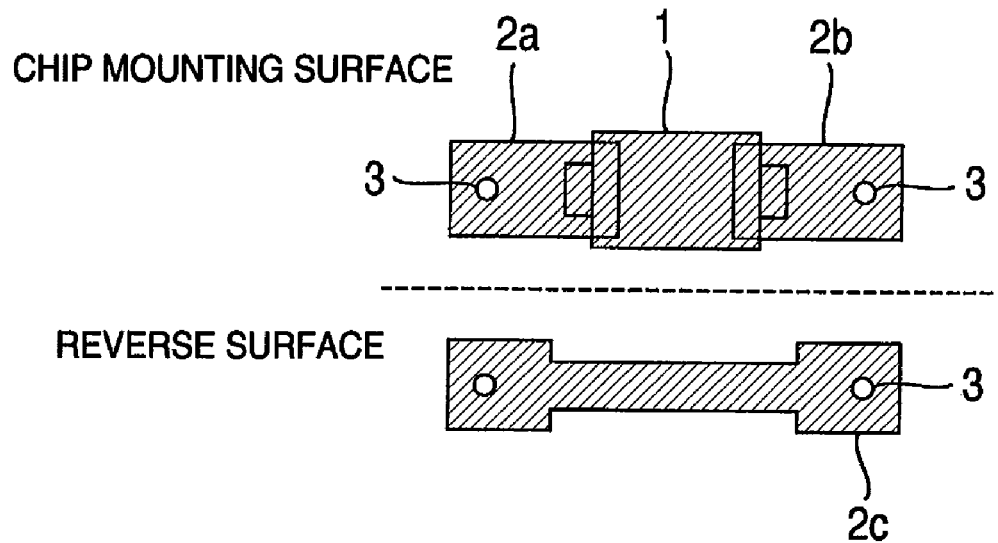
FIGS. 4A and 4B are views showing shapes of printed patterns.
Figure 4B:
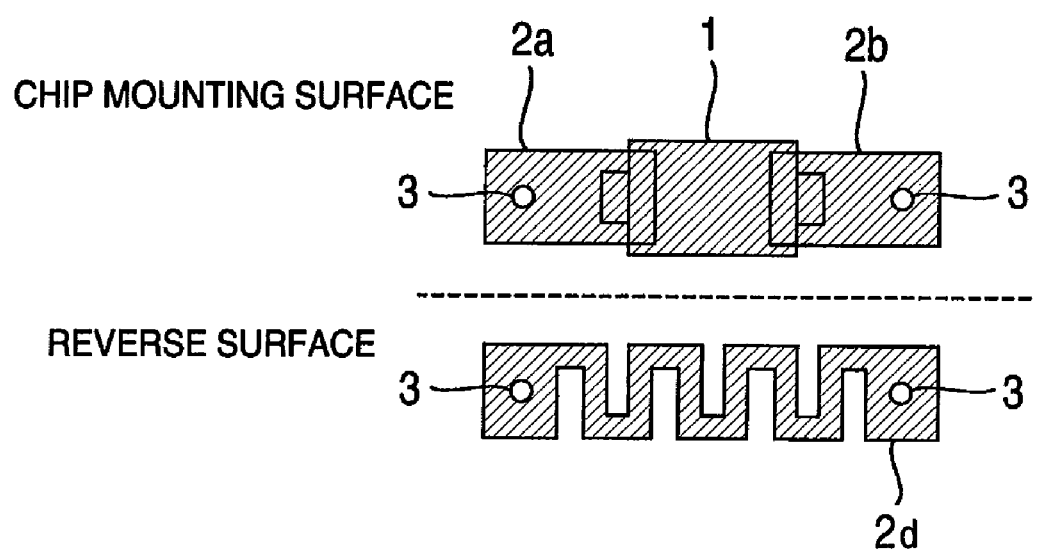

The shape of the printed pattern 2c will now be described with reference to FIGS. 4A and 4B. The pins 90a and 90b of the IC chip 1 are connected to the printed patterns 2a and 2b. The through holes 3 in the printed patterns 2a and 2b connect to the printed pattern 2c formed on a surface reverse to the surface where the IC chip 1 is mounted of the printed circuit board 5. The printed patterns 2a, 2b, and 2c form a stub which matches the impedances of the IC chip 1 and external antenna 40 when they are connected to each other. FIG. 4A shows a basic shape. In FIG. 4B, a printed pattern 2*d* has a meander shape. The meander shape is designed to increase the inductance and capacitance of the stub without making the occupied area different from that in the basic shape.

The stub to be formed here matches the impedances of the IC chip 1 and external antenna 40. The impedance of each connection 43 can be changed by adjusting the lengths of the radio emission unit 41 and field waveguide 42 of the external antenna 40. Minimizing the area of the stub to be formed on the printed circuit board 5 is thus an effective way for minimization of decrease in the component mounting density of the printed circuit board, which is to be achieved. The process of forming the stub on the printed circuit board 5 and connecting it to the IC chip 1 has the effect of preventing the IC chip from being damaged by static electricity. With this structure, the IC chip 1 can be stably used for a long period.

In an RFID tag according to this embodiment, the antenna which sends and receives radio waves is arranged away from the printed circuit board 5. For this reason, even if a region where the RFID tag is formed and another wiring pattern are located near each other, the region is less affected than a conventional structure in which wiring of a printed circuit board and an antenna pattern are formed in the same plane. It is thus possible to more efficiently mount the IC chip 1 on the printed circuit board 5.

Figure 5:
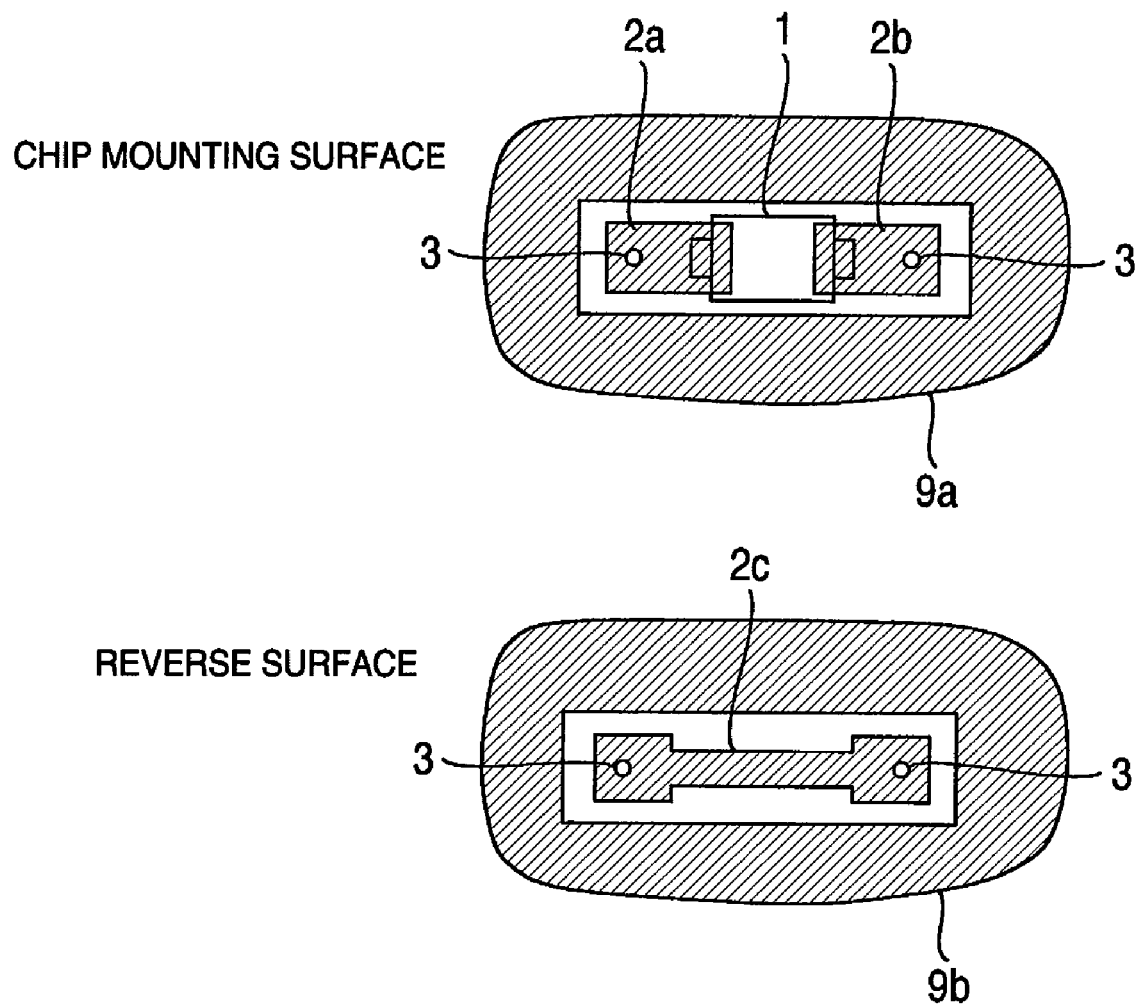
FIG. 5 is a view showing an example in which printed patterns are brought closer to the other printed patterns.

The occupied area of an RFID tag will be described with reference to FIG. 5. It is possible to bring peripheral patterns 9*a* and 9*b* close to the printed patterns 2*a*, 2*b*, and 2*c* forming the stub such that the widths of the space between the peripheral pattern 9*a* and the printed patterns 2*a* and 2*b* and that between the peripheral pattern 9*b* and the printed pattern 2*c* are about 0.5 mm. Since a stub pattern is little affected by a peripheral pattern, a stub pattern may be registered in advance in a library of a CAD system for printed circuit board formation. When designing a new printed circuit board, it is possible to easily mount an RFID tag by arbitrarily arranging such a stub pattern.

Second Embodiment

In the first embodiment, a balanced antenna, such as a dipole antenna, is used as the external antenna 40. As a second embodiment, an embodiment will be described in which an antenna of monopole type that is an unbalanced antenna is used as an external antenna 50.

FIG. 6 shows the shape of a stub formed on a printed circuit board 5. Printed patterns 2*a* and 2*b* on a surface where an IC chip 1 is mounted are the same as those in the first embodiment. A pattern on the reverse surface side is formed to have a shape like that of a printed pattern 2*e*. The shape is formed by connecting one end of a printed pattern 2*c* to a pattern larger in area than the printed pattern 2*c*. In many cases, specifically, a ground (ground potential) pattern is laid on the reverse surface of a printed circuit board, and the printed circuit board often has a number of large-area patterns. A pattern corresponding to the printed pattern 2*c* is connected to such a ground pattern.

Figure 7:
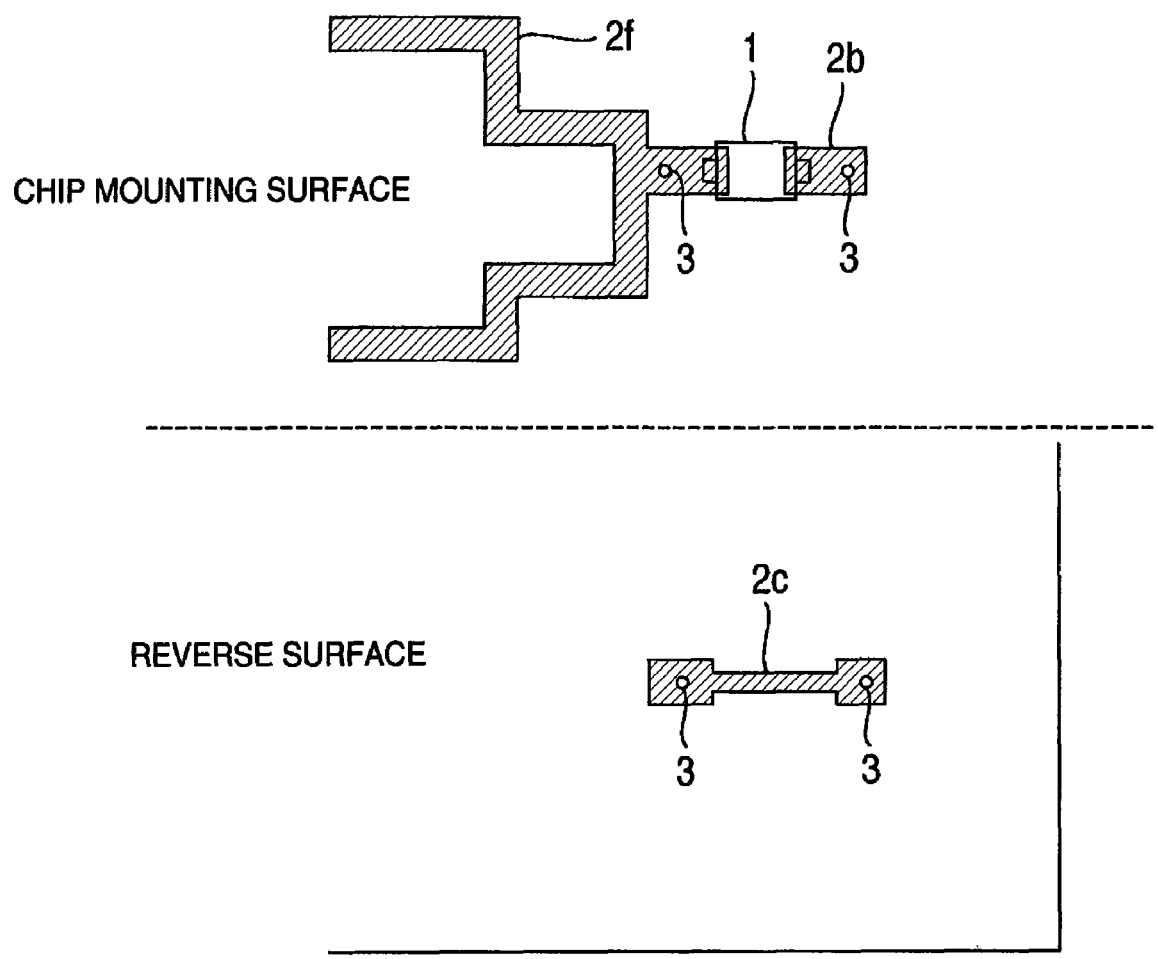
FIG. 7 is a view when a larger printed pattern is connected on a chip mounting surface side.

As another example, the printed patterns 2*a* and 2*b* on the surface where the IC chip 1 is mounted, i.e., on the obverse side of the printed circuit board 5 are connected to a pattern larger in area and length than the printed patterns 2*a* and 2*b*, as shown in FIG. 7. FIG. 7 shows an example in which the IC chip 1 is connected to a printed pattern 2*f*. Connection of a pattern to be connected to a wiring pattern with a length which is not less than λ/4 of a frequency used allows the IC chip 1 to operate efficiently. The IC chip 1 and the stub unit are connected to a wiring line, and it is necessary to select a wiring line which does not affect the operation of the wiring. Use of a power supply line operating on DC makes it possible to easily achieve these effects. If a connection pattern with a sufficiently large area is obtained with this structure, information stored in the IC chip 1 can be read without an external antenna, thus improving convenience.

Figure 8A:
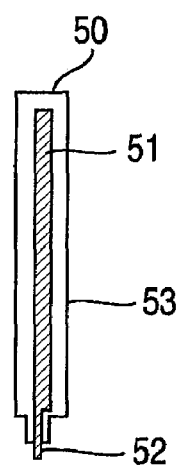
FIGS. 8A to 8C are views showing a monopole antenna as an external antenna.
Figure 8B:
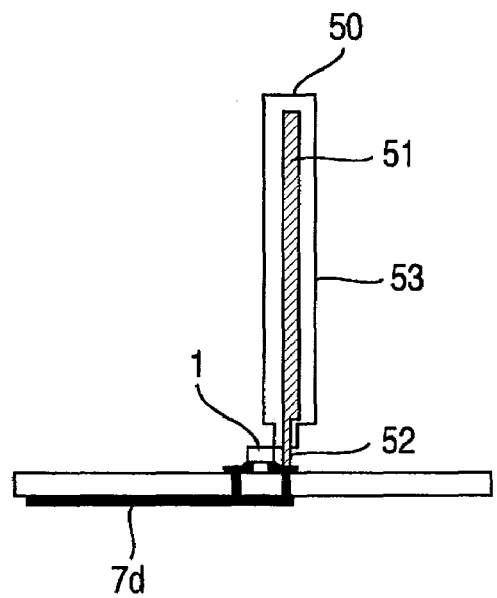
Figure 8C:
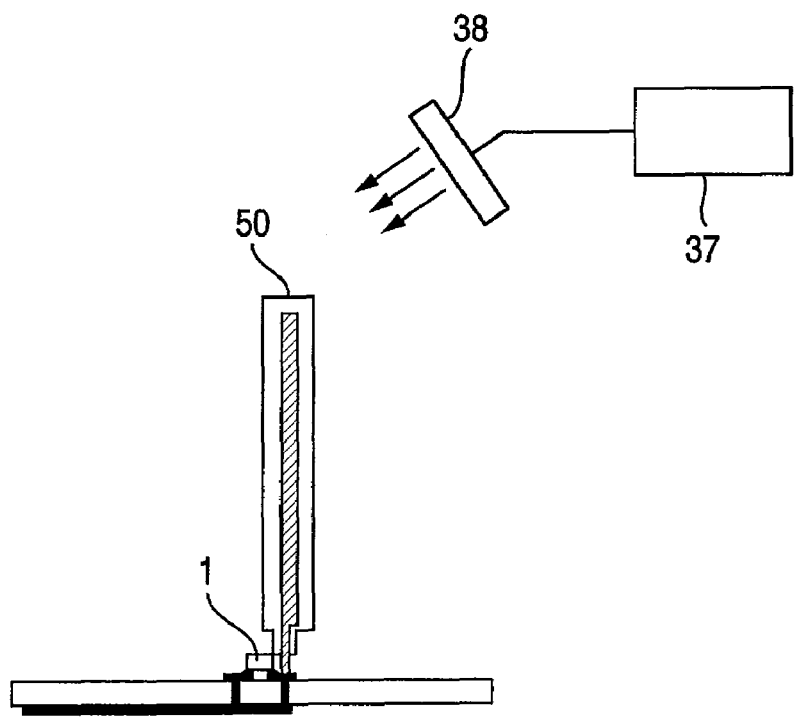

The external antenna 50 of monopole type will be described with reference to FIGS. 8A to 8C. FIG. 8A is a view showing the configuration of the external antenna 50. The external antenna 50 is composed of a sheathing unit 53 using, as a structural material, a material based on a resin, such as PC (polycarbonate), PP (polypropylene), or PET (polyethylene terephthalate), an antenna unit 51, a connection 52 to be connected to the IC chip 1, and a printed pattern 7*d* is formed on the backside of the printed circuit board. To connect the IC chip 1 and connection 52, it suffices to bring the connection 52 into direct contact with pins 90*a* and 90*b* of the IC chip 1 or bring the connection 52 into contact with the printed patterns 2*a* or 2*b* connected to the IC chip 1. Adoption of the external antenna 50 of monopole type allows use of a pen-shaped one as the external antenna 50 and improves workability. A reader device 37 and an antenna 38 for the reader device can be used in the same manner as in the first embodiment. A part of the antenna unit 51 in the external antenna 50 can be replaced with a coaxial cable, such as a semirigid cable, or the like.

Third Embodiment

In the first and second embodiments, when reading information in the IC chip 1, the external antenna 40 or 50 is used while being connected to the IC chip 1. As a third embodiment, an embodiment will be described for a case where it is necessary to continuously or intermittently read information in an IC chip 1 for a specified period. This embodiment is designed on the assumption that the need to read information on a printed circuit board arises in processes for repair and inspection of printed circuit boards.

Figure 9A:
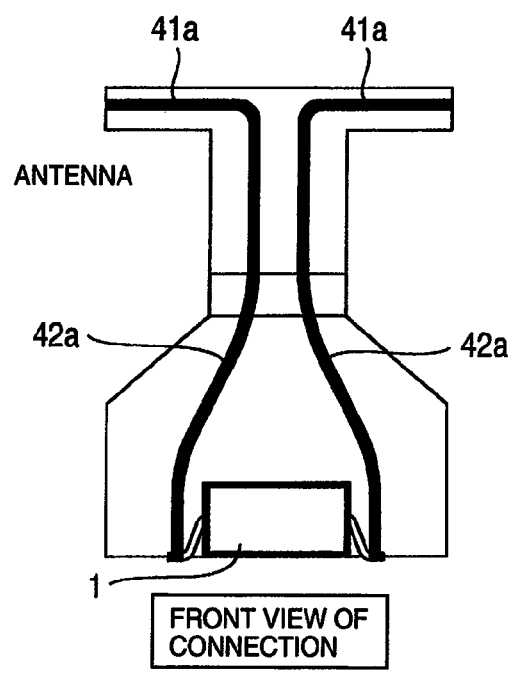
FIGS. 9A to 9C are views showing a clip-shaped sheathing unit as an external antenna.
Figure 9B:
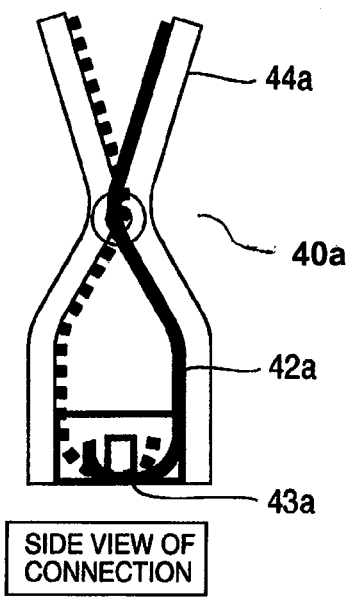
Figure 9C:
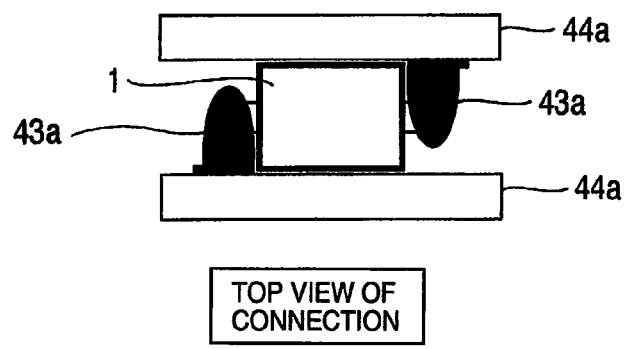

An external antenna 40*a* is clip-shaped, as shown in FIGS. 9A to 9C, and is kept up by sandwiching the IC chip 1. More specifically, the external antenna 40*a* is composed of a structural member 44*a* which forms a clip and is a molding made of a resin, such as PC (polycarbonate) or PP (polypropylene), antenna units 41*a*, field waveguide units 42*a*, and connections 43*a* to be connected to the IC chip 1. A springy metal, such as phosphor bronze, is used as the material for the connections 43*a*, and the connections 43*a* are configured such that electrodes thereof are pressed against electrodes of the IC chip 1. Plating of the connections 43*a* with gold improves electrical stability and usability.

Fourth Embodiment

Figure 10A:
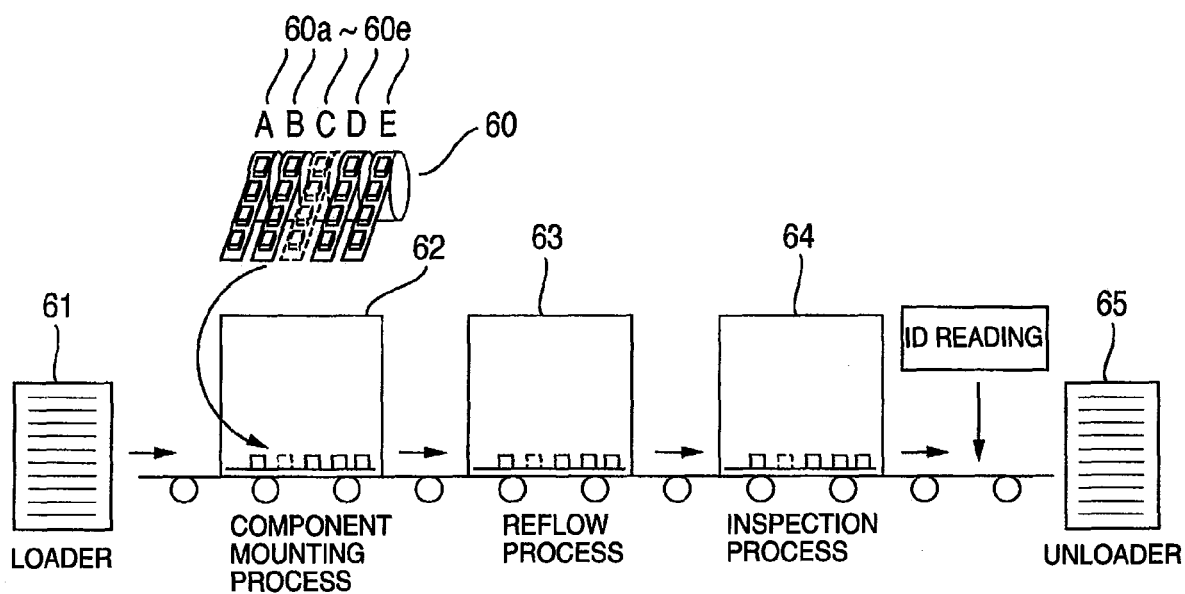
FIG. 10A is a chart showing a process flow.

A problem with a printed circuit board production line and a solution to the problem will be described. FIG. 10A shows a schematic view of a conventional production line. Only major devices are shown in FIG. 10A, and the others are omitted. A printed circuit board with no component mounted thereon is set in a cassette on a loader 61. A plurality of printed circuit boards are set in the cassette. A cassette of printed circuit boards is generally referred to as a batch. The printed circuit boards are sequentially transferred from the loader 61 toward the devices. When each printed circuit board advances to a component mounting process after a solder paste printing process (not shown), necessary components are mounted on the printed circuit board by a chip mounter 62. Component reels 60a to 60e in reel form are set on the chip mounter 62. Assume here that the component reel 60c is a reel for the IC chip 1 forming a part of an RFID tag. The IC chip 1 on the component reel 60c is mounted on the printed circuit board by the chip mounter 62 together with the other components. In a reflow process, the components are soldered and fixed by a reflow machine 63. Information stored in the IC chip 1 can be read only after the reflow. Generally, the information in the IC chip 1 is often read in an inspection process by an inspection device 64 or immediately in front of an unloader 65.

The problem with the process flow of the conventional method lies in that products are managed in batches of products set on the loader. A component under history management has the lot number of a printed circuit board and the lot numbers of component reels. If the component reel 60a has run out of components A during processing for a batch, the component reel 60a is replaced with another. This replacement causes components A of products which are mounted from the component reels 60a to have different lot numbers even if the products belong to the same batch. When mounting of components on all printed circuit boards is completed, and the printed circuit boards are returned to an unload cassette, it is impossible to determine for which printed circuit board the replacing component reel 60a has been used, which is a problem. Even if printed circuit boards are managed through batch control by the devices, a mix-up of printed circuit boards may occur after the printed circuit boards are taken out from the unloader 65, and the problem cannot be solved. Note that although components are mounted on all printed circuit boards in this embodiment, exceptions may be made.

FIG. 10B illustrates a printed circuit board management method according to the present invention. The device configuration in FIG. 10B is the same as that of the conventional method shown in FIG. 10A. The major difference between the device configurations lies in the position of an ID reading device 39 which reads information in the IC chip 1. In the method according to the present invention, the ID reading device 39 is arranged in a chip mounter 66. Before the IC chip 1 on the component reel 60c is mounted on a printed circuit board, information in the IC chip 1 is read by the ID reading device 39 arranged in the chip mounter 66. The read information is registered in a management server or the like and is managed together with the pieces of the of history information of the components.

As described above, use of information stored in the IC chip 1 from the middle of the manufacturing process allows printed circuit board-based management. This makes it possible to, even if problematic component reel replacement during processing for a batch has occurred, easily determine at which printed circuit board the component reel replacement has occurred. It is also possible to reliably manage the histories of components on a printed circuit board.

Since information in the IC chip 1 is reliably read before component mounting, a printed circuit board defect caused by the IC chip 1 can be eliminated. The present method thus has the advantage also in yield over the conventional method.

Effects of the present method will be described. In the conventional method, if a defect occurs in a component A after a reel for components A is replaced with another, a batch of printed circuit boards including the component A is regarded as an object to be removed. In contrast, the present method can remove only a printed circuit board having a target component mounted thereon by reading information in each IC chip 1, efficiently screen out defectives, and minimize monetary damage.

Figure 11:
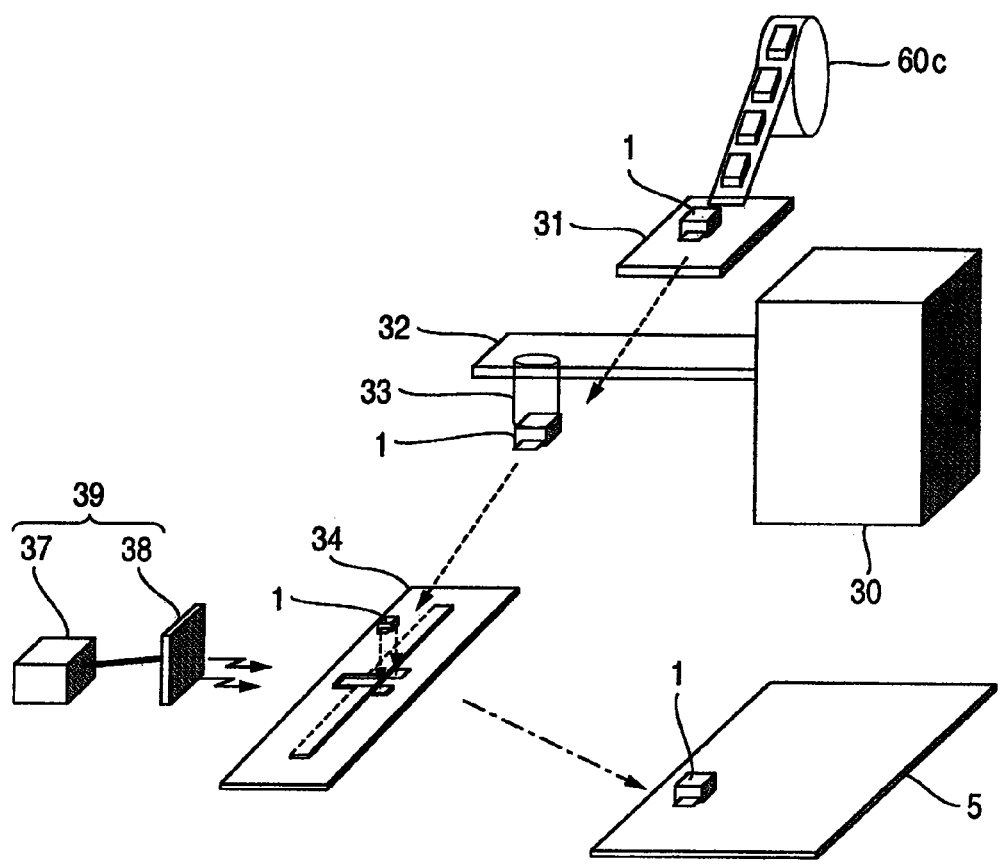
FIG. 11 is a schematic view showing the operation of a chip mounter according to the present invention.

The operation of the chip mounter 66 having the ID reading device 39 arranged therein will be described with reference to FIG. 11. The RFIC chip 1 is supplied from the component reel 60c. The component from the component reel 60c is held at a chucking stage 31. The IC chip 1 is picked up by a chucking nozzle 33 at an end of a transfer arm 32 attached to a chip transfer machine 30. The picked-up IC chip 1 comes into contact with contact pads 36 formed on an ID reading antenna 34 at pins 90a and 90b and electrically connects with the ID reading antenna 34. Information in the IC chip 1 is read by an ID reading device 39 which is composed of a reader device 37 and a reader antenna 38. If the reading from the IC chip 1 has been successfully performed, the IC chip 1 is transferred by the transfer arm and is mounted at a predetermined position on a printed circuit board 5.

The IC chip 1 is held at the ID reading antenna 34 by being vacuum-chucked by a vacuum chucking hole 29 formed between the contact pads 36. There is available another method in which the IC chip 1 is pressed against the ID reading antenna 34 while being held by a chucking arm.

Figure 12A:
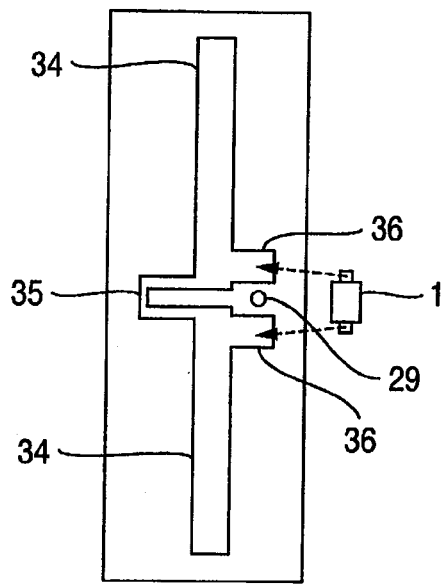
FIGS. 12A and 12B are views of an ID reading antenna attached to a chip mounter.
Figure 12B:
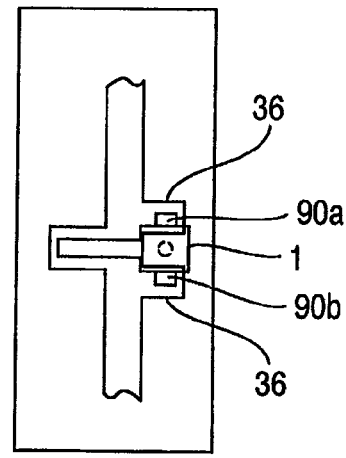

The ID reading antenna 34 has a shape as shown in FIGS. 12A and 12B and is composed of antenna units 34, a stub 35 for impedance matching, the contact pads 36, and the vacuum chucking hole 29. The ID reading antenna 34 can be fabricated by using a ceramic material, an RF4 board which is a printed circuit board material, or the like as a base material and putting metal foil over or evaporating metal onto the base material. Plating the contact pad units 36 with Au or evaporating Au onto them to a thickness of 20 to 60 μm improves electrical stability. Although a dipole antenna is employed in this embodiment, the present invention is not limited to this. Any other radiation antenna may be employed.

Fifth Embodiment

Figure 13:
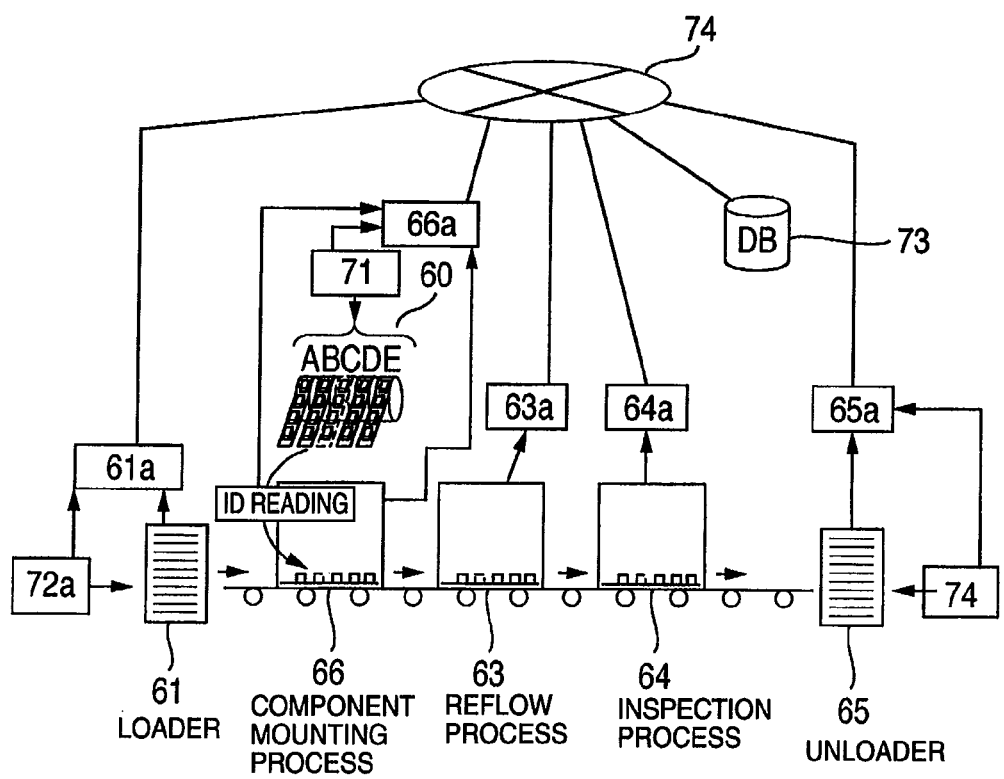
FIG. 13 is a conceptual diagram of a printed circuit board manufacturing history system.

FIG. 13 shows the conceptual configuration of a printed circuit board manufacturing history system into which the fourth embodiment is formed. The system is structured such that a loader control circuit 61a, a chip mounter control circuit 66a, a reflow control circuit 63a, an inspection process control circuit 64a, and an unloader control circuit 65a are connected to a manufacturing history management server 73 storing manufacturing history management data over a communication network 74 and such that a history including a processing condition of a device for a printed circuit board and the status of the device is stored in real time.

More specifically, barcodes or RFID tags are attached to printed circuit boards supplied from a printed circuit board manufacturing process, one per lot. Before setting the printed circuit boards on a loader 61, the barcodes or RFID tags are read by a barcode reader or RFID reader 72a. Pieces of information obtained by the reading are stored in the server via the loader control circuit. Before component reels 60 to be set on a chip mounter 66 are set on the device, pieces of information in barcodes or RFID tags attached to the component reels are read by a barcode reader or RFID reader 71. The pieces of information are stored in the manufacturing history management server 73 via the chip mounter control circuit.

Only some of the devices used in a manufacturing process are shown in FIG. 13. It is possible to perform more elaborate history management by uploading processing conditions of other devices not shown, the statuses of the devices, and the like to the manufacturing history management server 73 and linking them to information on manufactured printed circuit boards.

Sixth Embodiment

Figure 14:
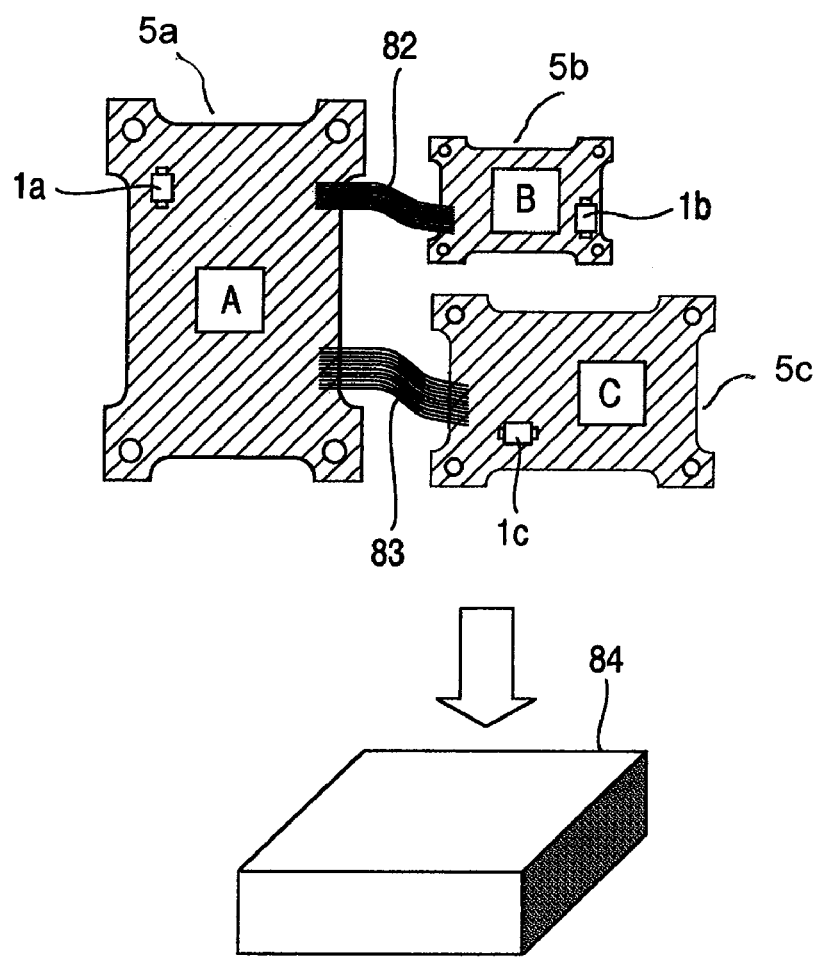
FIG. 14 is a schematic view of a piece of equipment composed of a plurality of printed circuit boards.

A method for managing the history of a piece of electrical equipment which is composed of a plurality of printed circuit boards will be described with reference to FIG. 14. FIG. 14 illustrates a case where a piece of electrical equipment is composed of three printed circuit boards 5a, 5b, and 5c. When a piece 84 of electrical equipment composed of the three printed circuit boards is finished, it is generally assigned a serial number. A manufacturing history management server 73 stores, using a product number as a header, pieces of information from IC chips 1a to 1c mounted on the printed circuit boards 5a to 5c while the pieces of information are cross-linked. The cross-link makes it possible to identify a target one of the constituent boards from linked printed circuit board information even if the constituent board is missing or an RFID in the constituent board is inoperative. Further linking of the histories of a housing, other components, and the like to the pieces of information described above allows more extensive management.

Seventh Embodiment

A problem with a method for manufacturing a plurality of small printed circuit boards from a large printed circuit board and a solution to the problem will be described. Here, a large printed circuit board is defined as a parent board 92, and small divided printed circuit boards are defined as child boards. A problem with a conventional method will be described with reference to FIG. 15. The nine child boards are formed on the parent board 92, and at the same time, nine RFID tags 91a to 91i are finished. As a result, although pieces of information in nine IC chips can be acquired by a reading device, the pieces of information cannot be associated with the child boards. It is thus impossible to completely associate the child boards with mounted components.

In this embodiment, at the parent board, i.e., one large printed circuit board (larger than, e.g., a predetermined size), a component is mounted while storing information in an IC chip 1 and a position on the printed circuit board 92 where the component is mounted by a chip mounter 66. This makes it possible to link information in the corresponding IC chip 1 to each of the child boards 92a to 92i and manage the histories of components on the child boards.

FIGS. 16A and 16B are views showing the shape of an IC chip and the shape of a printed pattern according to yet another embodiment of the present invention. Specifically, FIGS. 16A and 16B show specific dimensions of the printed patterns 2a and 2b and the IC chip 1 as well as the dimensions of the contact pins 90a and 90b.

It will be further understood by those skilled in the art that the foregoing description has been made on embodiments of the invention and that various changes and modifications may be made in the invention without departing from the spirit of the invention and scope the appended claims.

The invention claimed is:

1. An RFID tag mounting circuit board in which an RFID tag is mounted on a board, the RFID tag comprising:
   an IC chip storing information;
   an antenna connection terminal to which an antenna can be connected for sending the information stored in the IC chip by radio waves; and
   an impedance matching circuit for the antenna,
   wherein the impedance matching circuit is composed of a through hole pattern in the RFID tag mounting circuit board and printed patterns on upper and lower surfaces of the RFID tag mounting circuit board,
   wherein the through hole pattern connects the printed patterns on the upper and lower surfaces of the RFID tag mounting circuit board to each other,
   wherein a length of the printed pattern on the lower surface of the RFID tag mounting circuit board is varied in order to provide impedance matching, and
   wherein the antenna connection terminal is arranged such that the antenna is connected so as to extend perpendicularly to the RFID tag mounting circuit board.

2. The RFID tag mounting circuit board according to claim 1, wherein the impedance matching circuit is composed of an uppermost layer and a lowermost layer on the RFID tag mounting circuit board.

3. The RFID tag mounting circuit board according to claim 1, wherein the antenna is an external antenna connected to the antenna connection terminal which sends out the information stored in the IC chip.

4. The RFID tag mounting circuit board according to claim 3, wherein the external antenna is T-shaped.

5. The RFID tag mounting circuit board according to claim 4, wherein the T-shaped external antenna has a radiation antenna unit, and the radiation antenna unit is a dipole antenna with a length of $\lambda/2$.

6. The RFID tag mounting circuit board according to claim 3, wherein the external antenna is an I-shaped monopole antenna.

7. The RFID tag mounting circuit board according to claim 6, wherein the I-shaped external antenna has a radiation antenna unit, and the radiation antenna unit is a monopole antenna whose length is an odd multiple of $\lambda/4$.

8. The RFID tag mounting circuit board according to claim 3, wherein the external antenna is clip-shaped and protrudes away from the IC chip and connects to the IC chip by sandwiching the IC chip.

9. The RFID tag mounting circuit board according to claim 1, wherein the printed pattern on the lower surface of the RFID tag mounting circuit board has a meandering shape.

10. The RFID tag mounting circuit board according to claim 1, wherein one end of the printed pattern on the lower surface of the RFID tag mounting circuit board forming a part of the impedance matching circuit is connected to an adjacent printed pattern outside the RFID tag, and the RFID tag has a monopole antenna structure.

11. The RFID tag mounting circuit board according to claim 10, wherein the adjacent printed pattern outside the RFID tag has a length which is not less than $\lambda/4$.

* * * * *